(12) United States Patent
Zhu et al.

(10) Patent No.: US 10,068,803 B2
(45) Date of Patent: Sep. 4, 2018

(54) PLANARIZATION PROCESS

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Jun Luo, Beijing (CN); Chunlong Li, Beijing (CN); Jian Deng, Beijing (CN); Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 40 days.

(21) Appl. No.: 14/722,597

(22) Filed: May 27, 2015

(65) Prior Publication Data

US 2015/0262883 A1    Sep. 17, 2015

Related U.S. Application Data

(63) Continuation of application No. PCT/CN2012/087003, filed on Dec. 20, 2012.

(30) Foreign Application Priority Data

Nov. 30, 2012 (CN) .......................... 2012 1 0505359

(51) Int. Cl.
*H01L 21/8234* (2006.01)
*H01L 21/3105* (2006.01)
(Continued)

(52) U.S. Cl.
CPC .... *H01L 21/823431* (2013.01); *H01L 21/265* (2013.01); *H01L 21/3083* (2013.01);
(Continued)

(58) Field of Classification Search
CPC ................... H01L 21/31051–21/31056; H01L 21/32115–21/32125
See application file for complete search history.

(56) References Cited

U.S. PATENT DOCUMENTS 5,091,048 A * 2/1992 Thomas ............ H01L 21/31055
156/345.39
5,498,565 A * 3/1996 Gocho ................ H01L 21/3065
257/E21.218
(Continued)

FOREIGN PATENT DOCUMENTS

CN       1477683 A      2/2004
CN     10155920 A     10/2009
(Continued)

OTHER PUBLICATIONS

Office Action dated Dec. 24, 2015 for Chinese Patent Application No. 201210505359.6, filed Sep. 23, 2010.
(Continued)

*Primary Examiner* — Joshua King
(74) *Attorney, Agent, or Firm* — Knobbe Martens Olson & Bear LLP (57) ABSTRACT

A planarization process is disclosed. The method includes forming a trench in an area of a material layer which has a relatively high loading condition for sputtering. The method further includes sputtering the material layer to make the material layer flat.

12 Claims, 10 Drawing Sheets

(51) Int. Cl.

| | |
|---|---|
| *H01L 21/311* | (2006.01) |
| *H01L 21/762* | (2006.01) |
| *H01L 21/265* | (2006.01) |
| *H01L 21/306* | (2006.01) |
| *H01L 21/308* | (2006.01) |
| *H01L 21/321* | (2006.01) |
| *H01L 29/10* | (2006.01) |
| *H01L 29/66* | (2006.01) |
| *H01L 21/3213* | (2006.01) |
| *H01L 29/78* | (2006.01) |

(52) U.S. Cl.
CPC .. *H01L 21/30604* (2013.01); *H01L 21/31053* (2013.01); *H01L 21/31055* (2013.01); *H01L 21/31056* (2013.01); *H01L 21/31105* (2013.01); *H01L 21/32115* (2013.01); *H01L 21/32132* (2013.01); *H01L 21/76229* (2013.01); *H01L 21/823481* (2013.01); *H01L 29/1083* (2013.01); *H01L 29/6681* (2013.01); *H01L 29/66795* (2013.01); *H01L 29/66803* (2013.01); *H01L 29/7848* (2013.01); *H01L 21/823437* (2013.01); *H01L 29/66545* (2013.01)

(56) References Cited

U.S. PATENT DOCUMENTS

| | | | | |
|---|---|---|---|---|
| 5,747,385 A * | 5/1998 | Torii | | B24C 1/003 257/E21.23 |
| 5,928,960 A * | 7/1999 | Greco | | H01L 21/31053 216/38 |
| 5,998,279 A * | 12/1999 | Liaw | | H01L 21/76232 257/E21.548 |
| 6,251,795 B1 | 6/2001 | Shan | | C23C 16/402 204/192.23 |
| 6,280,644 B1 * | 8/2001 | Martin | | H01L 21/31056 216/16 |
| 6,288,357 B1 * | 9/2001 | Dyer | | C03C 15/02 204/192.34 |
| 6,365,523 B1 * | 4/2002 | Jang | | H01L 21/31053 257/E21.244 |
| 6,436,806 B2 | 8/2002 | Lee | | |
| 6,660,612 B1 * | 12/2003 | Chang | | H01L 21/76229 257/E21.548 |
| 6,734,110 B1 | 5/2004 | Jang et al. | | |
| 6,790,742 B2 * | 9/2004 | Yang | | H01L 21/76229 257/E21.548 |
| 6,838,357 B2 * | 1/2005 | Chen | | H01L 21/76229 257/E21.548 |
| 2005/0003668 A1 * | 1/2005 | Hung | | H01L 21/31055 438/691 |
| 2005/0170661 A1 * | 8/2005 | Economikos | | H01L 21/76229 438/759 |
| 2007/0221956 A1 * | 9/2007 | Inaba | | H01L 21/823807 257/197 |
| 2008/0191249 A1 * | 8/2008 | Hsieh | | H01L 27/14698 257/290 |
| 2009/0258502 A1 | 10/2009 | Bae et al. | | |
| 2010/0127395 A1 * | 5/2010 | He | | H01L 21/31056 257/752 |
| 2010/0258870 A1 * | 10/2010 | Hsu | | H01L 29/785 257/347 |
| 2013/0224945 A1 * | 8/2013 | Liu | | H01L 29/66795 438/595 |

FOREIGN PATENT DOCUMENTS

| | | |
|---|---|---|
| CN | 101924133 A | 12/2010 |
| CN | 102543714 A | 7/2012 |
| CN | 102668061 A | 9/2012 |
| JP | 8-56024 A | 2/1996 |
| JP | 9-102472 A | 4/1997 |

OTHER PUBLICATIONS

International Search Report and Written Opinion in International Application No. PCT/CN2012/086765, dated Sep. 5, 2013.
International Search Report for International Application No. PCT/CN2012/087003, dated Sep. 19, 2013.
Okano, K. et al. "Process Integration Technology and Device Characteristics of CMOS FinFET on Bulk Silicon Substrate with sub-10 nm Fin Width and 20 nm Gate Length." IEDM 2005, Dec. 5, 2005, pp. 721-724.
Chinese Office Action dated Jul. 15, 2016 for Chinese Application No. 201210505359.6 which corresponds in priority to above-identified subject U.S. application.

* cited by examiner

PLANARIZATION PROCESS

RELATED APPLICATIONS

This application claims priority to International Application No. PCT/CN2012/087003, filed on Dec. 20, 2012, entitled "PLANARIZATION PROCESSING METHOD," and Chinese Application No. 201210505359.5, filed on Nov. 30, 2012, each of which is incorporated herein by reference in its entirety.

BACKGROUND

Field

The disclosed technology relates to the semiconductor technology, and particularly to a method of planarizing a material layer formed on a substrate.

Description of the Related Technology

Planarization processes such as chemical mechanical polishing (CMP) are used in semiconductor processing or manufacturing to obtain relatively planar surfaces. However, it may be difficult to control surface flatness of a material layer to within a tolerance, of, for example, several nanometers, particularly if a portion of the material layer needs to be grounded. Planarizing a surface within a desired tolerance may be difficult with existing methods when the material layer covers features of nonuniform lengths, widths, and/or heights. There is a need for systems and methods to consistently planarize material layers formed on substrates within desired tolerances, even if the material layer covers nonuniform features.

SUMMARY OF CERTAIN INVENTIVE ASPECTS

The disclosed technology includes a planarization process, by which it is possible to achieve a substantially uniform and relatively planar surface.

One aspect of the disclosed technology is a method of planarizing a material layer formed on a substrate. The method includes forming at least one trench in a first area of the material layer, the first area having a higher loading condition for sputtering than a second area of the material layer. The method further includes performing sputtering on the material layer to planarize the material layer.

BRIEF DESCRIPTION OF THE DRAWINGS

The above and other objects, features and advantages of the disclosed technology will become apparent from the following description of embodiments of the disclosed technology with reference to attached drawings.

FIG. 13B shows a cross-sectional view along line BB' in FIG. 13A.

DETAILED DESCRIPTION OF CERTAIN INVENTIVE ASPECTS

Next, the disclosed technology will be described with reference to the drawings. These descriptions are provided for illustrative purpose, rather than limiting the disclosed technology. Further, descriptions of known structures and techniques are omitted so as not to obscure the concept of the disclosed technology.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the disclosed technology, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In an embodiment of the disclosed technology, a material layer may be planarized by sputtering of Ar or N plasma. Due to such planarization by sputtering, instead of conventional planarization by CMP, it is possible to achieve a relatively flat surface of the material layer. The material layer may comprise a variety of material layers used in semiconductor manufacture processes, for example, including but not limited to, an insulator material layer, a semiconductor material layer and a conductive material layer.

Variations in the thickness or height of the material layer may correspond to different sputtering loads at different locations. For example, the material layer at a first location may be higher or thicker than at a second location. Therefore, more sputtering may be necessary at the first location than the second location for the two locations to be planarized to the same height. This corresponds to a loading effect in the sputtering due to nonuniformities, with a larger load at surface locations that need more sputtering, and a smaller load at locations that need less sputtering. The so-called "loading effect" means that the material layer may have its thickness and/or morphology and the like after the sputtering affected by a pattern present in the material layer as well as a density of the pattern (or morphology of the material layer) and the like. Therefore, an embodiment may take the loading effect into account in the sputtering to obtain a relatively flat surface.

For example, if the material layer comprises a raised portion due to an underlying (raised) feature, an area where the raised portion is located may require "more" sputtering than another area where there is no raised portion, so that this area can be kept substantially flat with the other area. More sputtering may correspond to sputtering for a longer time period under the same sputtering parameters (for example, sputtering power and/or atmospheric pressure); or a greater sputtering intensity (for example, greater sputtering power and/or atmospheric pressure) for the same sputtering time period; or some combination of the two. In this example, the raised portion has a larger loading condition for the sputtering.

On the other hand, if the material layer comprises a recessed portion due to an underlying (recessed) feature, an area where the recessed portion is located may require "less" sputtering than another area where there is no recessed portion, so that this area may be kept substantially flat with the other area. That is, the recessed portion has a smaller loading condition for the sputtering.

Further, if there are a plurality of non-uniformly distributed features, the material layer may have non-uniformly distributed bulges and/or recesses due to the features. Therefore, this causes the loading condition vary across the substrate. For example, for the bulges, the loading condition of an area in which a distribution density is larger is higher than that of an area in which the distribution density is smaller; and for the recesses, the loading condition of an area in which the distribution density is larger is lower than that of an area in which the distribution density is lower. Uniform sputtering or planarization across a surface with variable surface heights, and associated variable loading requirements, may result in nonuniform surfaces that may not meet required surface flatness tolerances.

In an embodiment, photolithography may be incorporated into the planarization process of the material layer by sputtering, so as to implement selective planarization. For example, before sputtering, a trench may be formed in the area of the material layer in which the loading condition is relatively high (for example, where there is a bulge), so as to reduce the loading condition. Thus, the distribution uniformity of the loading condition across the whole material layer can be improved. As such, the subsequent sputtering may be performed in a substantially uniform manner across the substrate, which may facilitate obtaining a flat surface.

Further, if a plurality of non-uniformly distributed features are formed on the substrate (resulting in, for example, a plurality of non-uniformly distributed bulges on the material layer), the number of trenches formed in an area in which the features are distributed densely (where the bulges are distributed densely, corresponding to a relatively high loading condition) may be greater than that formed in an area in which the features are distributed sparsely (where the bulges are distributed sparsely, corresponding to a relatively low loading condition). Thus, the loading conditions on the two types of areas may be more approximate to each other, i.e., the uniformity of the loading condition can be improved. According to an example, the number of the trenches formed in the area in which the features are distributed sparsely may be even zero.

The above described features may comprise various features capable of being formed on the substrate, including but not limited to, a raised feature, such as gate and fin, on the substrate, and/or a recessed feature, such as a gate trench formed by removing a sacrificial gate in a gate last process, on the substrate.

In an embodiment, the trench(es) as described above may be achieved by patterning the material layer with a mask. Since the distribution of the loading condition across the material layer is dependent on the feature(s) under the material layer, the mask may be designed according to a mask for forming the features. According to an example, the trench(es) may be formed in a pattern which is substantially identical to or complementary with a pattern of the feature(s) through positive or negative photoresist by using a mask which is substantially identical or opposite to the mask for forming the features.

FIGS. 1-17 illustrate cross sectional and top views during intermediate steps of a method of planarizing a material layer formed on a substrate in an embodiment. As shown in the cross sectional view of FIG. 1, a substrate 1000 may be provided. The substrate 1000 may comprise various forms of substrates, for example, a bulk semiconductor substrate such as a bulk Si substrate, a Semiconductor-on-Insulator (SOI) substrate, a SiGe substrate, or the like. In the following descriptions, the bulk Si substrate is described by way of example.

The substrate 1000 may be patterned to form fins thereon. In an embodiment, patterned photoresist (not shown) may be formed on the substrate 1000 according to the design, and then the substrate 1000 may be etched by, for example, Reactive Ion Etching (RIE), with the patterned photoresist as a mask, in order to form the fins 1002. Then, the photoresist may be removed. In the example as shown in FIG. 1, the fins 1002 have a relatively high distribution density in an area 100-1 while a relatively low distribution density in an area 100-2 according to design requirements.

Figure 1:
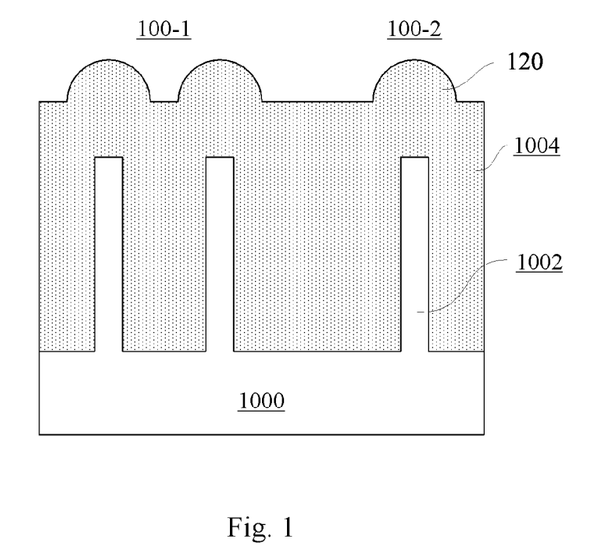
FIG. 1 is a cross sectional view during an intermediate step of a planarization process in an embodiment.

In an embodiment, the shape of the trench (between the fins) formed by etching is not necessarily a regular rectangle as shown in FIG. 1, but may be tapered from top down. Further, positions and the number of the fins formed are not limited to the example as shown in FIG. 1.

In an embodiment, the fin is not formed by directly patterning the substrate. The fin may be formed by epitaxially growing another semiconductor layer on the substrate and then patterning the other semiconductor layer. If there is sufficient etching selectivity between the other semiconductor layer and the substrate, the patterning of the fin may be stopped at the substrate, so as to implement a more precise control on a height of the fin.

An isolation layer may be formed on the substrate after the fins are formed by the above process.

FIG. 1 illustrates that a dielectric layer 1004 may be formed on the substrate by, for example, deposition, so as to cover the formed fins 1002. In an embodiment, the dielectric layer 1004 may comprise oxide such as silicon oxide. Due to the presence of the fins 1002, bulges 120 may exist on the dielectric layer 1004. Accordingly, bulges 120 have a relatively high distribution density in the area 100-1 while a relatively low distribution density in the area 100-2. In an embodiment, the dielectric layer 1004 is planarized by, for example, sputtering.

Figure 2:
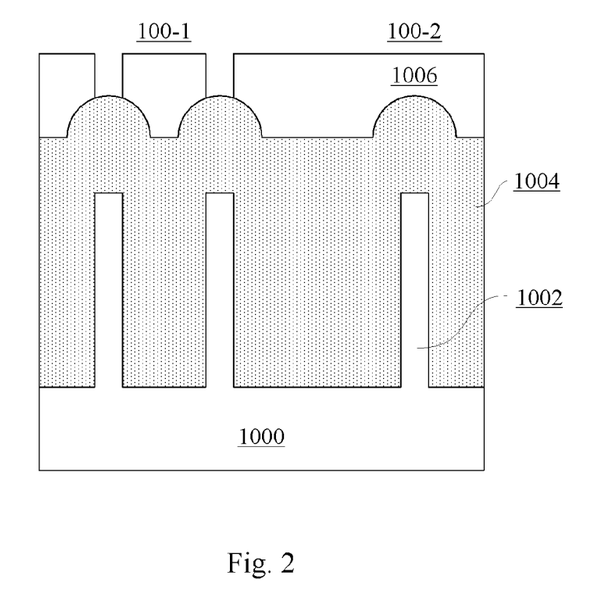
FIG. 2 is a cross sectional view during an intermediate step of a planarization process in an embodiment.

FIG. 2 is a cross sectional view during an intermediate step of a planarization process in an embodiment. In order that the sputtering may be performed uniformly across the substrate, the dielectric layer 1004 may be patterned firstly. Photoresist 1006 may be coated on the dielectric layer 1004, and then patterned by operations such as exposure via a mask and development. The loading condition for the subsequent sputtering is taken into account in patterning the photoresist 1006. In the example as shown in FIG. 2, the photoresist 1006 is patterned so that there is an opening on the bulge in the area 100-1, while there is no opening in the area 100-2. For example, the mask for exposing the photoresist 1006 may be designed according to the mask for forming the fins 1002. The mask for forming the fins may determine the locations, the shape and/or the size of the fins 1002, and thus may partially determine fluctuations of the dielectric layer 1004.

Figure 3:
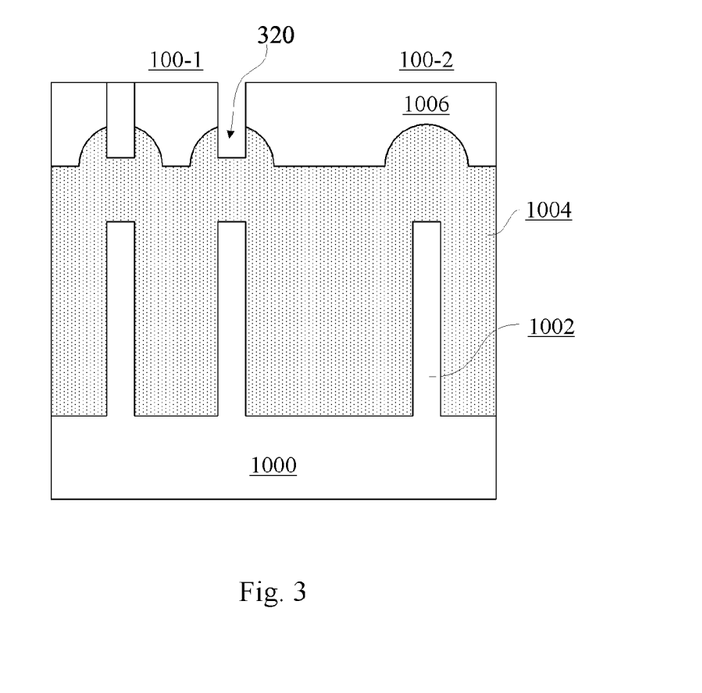
FIG. 3 is a cross sectional view during an intermediate step of a planarization process in an embodiment.

FIG. 3 is a cross sectional view during an intermediate step of a planarization process in an embodiment. FIG. 3 illustrates that the dielectric layer 1004 may be patterned by, for example, RIE with the patterned photoresist 1006 as a mask, so as to form trenches 320 in the dielectric layer 1004.

Here, the patterning of the dielectric layer 1004 may be controlled, so as to be stopped near the substantially lowest portion of a top surface of the dielectric layer 1004, In an embodiment, this corresponds to a height within a range of 50 nm above or below the lowest portion of the top surface. The lowest portion of the top surface of the dielectric layer 1004 may be determined according to the thickness of the deposited dielectric layer 1004. Further, the stop point for the patterning of the dielectric layer 1004 may be determined according to a process parameter such as an etching rate of RIE. Then, the photoresist 1006 may be removed.

Thus, the loading condition on the area 100-1 is reduced, and thus may approximate or even become nearly equal to the loading condition on the area 100-2. This facilitates the subsequent sputtering to be performed uniformly.

In the example of FIG. 3 trenches 320 are formed in the bulges in the area 100-1, but not in the area 100-2. In an embodiment, one or more trenches may be formed in bulges in the area 100-2, which may reduce the non-uniformity of the loading condition between the areas 100-1 and 100-2.

Figure 4:
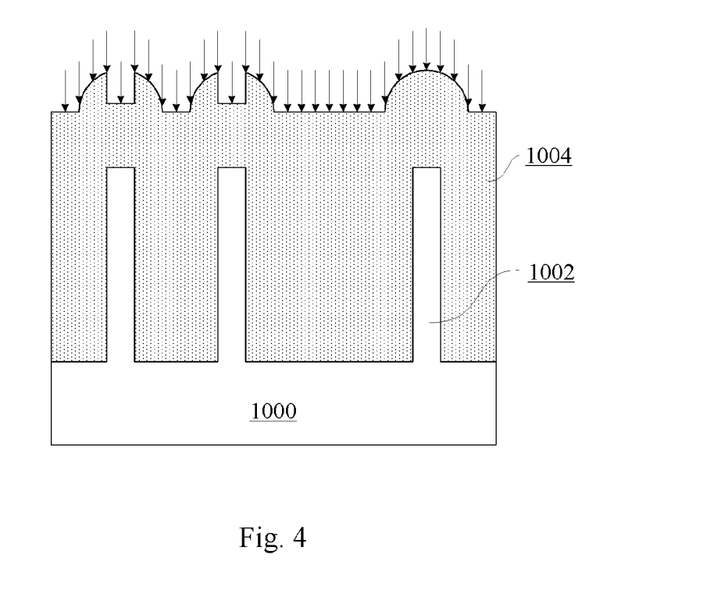
FIG. 4 is a cross sectional view during an intermediate step of a planarization process in an embodiment.

FIG. 4 is a cross sectional view during an intermediate step of a planarization process in an embodiment. Next, as shown in FIG. 4, the dielectric layer 1004 may be subjected to sputtering so as to be planarized. For example, plasma such as Ar or N plasma may be used for sputtering. Here, sputtering parameters, such as sputtering power and atmospheric pressure, may be controlled according to a cutting rate of the plasma sputtering on the dielectric layer 1004, so as to determine a time period for the plasma sputtering. Thus, the plasma sputtering can be performed for a certain time period so as to sufficiently smooth the surface of the dielectric layer 1004. Since the uniformity of the loading condition across the substrate is improved due to the trenches 320, the sputtering can be performed in a substantially uniform way, resulting in a relatively flatter surface.

Figure 5:
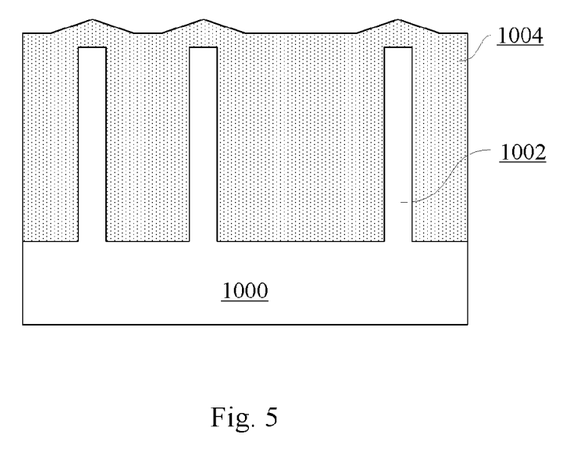
FIG. 5 is a cross sectional view during an intermediate step of a planarization process in an embodiment.

FIG. 5 is a cross sectional view during an intermediate step of a planarization process in an embodiment. FIG. 5 shows a result after planarization by sputtering. Although FIG. 5 shows microscopic fluctuations, the surface of the dielectric layer 1004 actually has a sufficient flatness, with fluctuations thereof controlled within several nanometers (for example, with a tolerance of 2 nanometers). In the example as shown in FIG. 5, the plasma sputtering may be stopped before reaching the top surface of the fins 1002, so as to avoid damaging the fins 1002. According to another embodiment of the disclosed technology, CMP may also be performed at a low (little) dose as required on the dielectric layer 1004 after planarization by sputtering.

Figure 6:
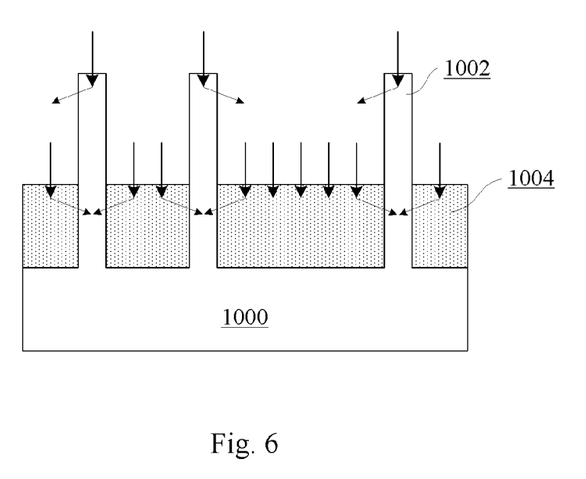
FIG. 6 is a cross sectional view during an intermediate step of a planarization process in an embodiment.

After the surface of the dielectric layer 1004 is sufficiently smoothed by the plasma sputtering, the dielectric layer 1004 may be etched back by, for example, RIE to expose a portion of the respective fins 1002, as shown in FIG. 6. The exposed portion of the fin 1002 may be subsequently used as a real fin for a final device. The isolation layer may be constituted by the remaining dielectric layer 1004. Since the surface of the dielectric layer 1004 becomes smooth by sputtering before the back-etching, the surface of the isolation layer 1004 may be substantially consistent (for example, within a flatness tolerance) across the substrate after the back-etching.

Figure 7:
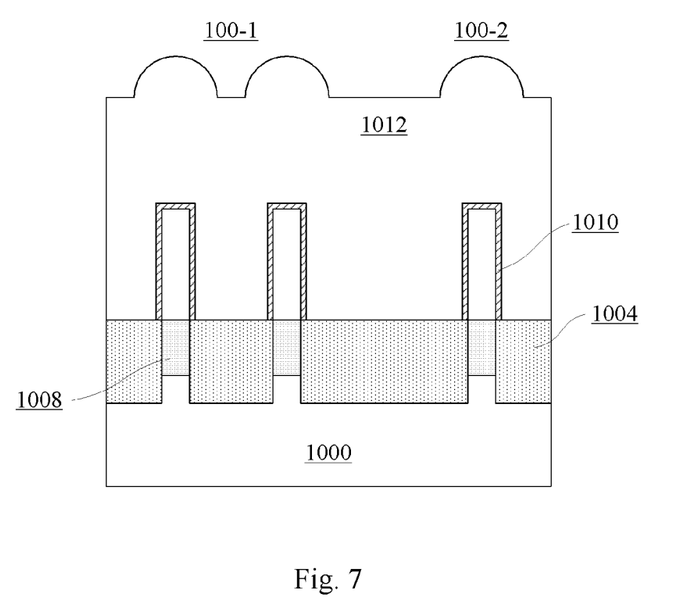
FIG. 7 is a cross sectional view during an intermediate step of a planarization process in an embodiment.

FIG. 6 is a cross sectional view during an intermediate step of a planarization process in an embodiment. In an embodiment, a punch-through stopper 1008 (as shown in FIG. 7) may be formed by implantation in order to improve device performances, as shown by arrows in FIG. 6. For example, p-type impurities such as B, $BF_2$ or In may be implanted for an n-type device; and n-type impurities such as As or P may be implanted for a p-type device. The ion implantation may be carried out in a direction substantially perpendicular to the surface of the substrate. Parameters for the ion implantation may be controlled, so that the punch-through stopper 1008 may be formed in a portion of the fin which is located below the surface of the isolation layer 1004 and may have a desired doping concentration. It should be noted that a part of dopants (ions or elements) may be scattered from the exposed portions of the fin due to a form factor of the fins. Thus, it is beneficial to form an abrupt doping distribution in a depth direction. Annealing may be performed to activate the implanted impurities. Such a punch-through stopper may facilitate to reduce leakage between source and drain.

FIG. 7 is a cross sectional view during an intermediate step of a planarization process in an embodiment. A gate stack across the fin may be formed on the isolation layer 1004. A gate dielectric layer 1010 may be formed by, for example, deposition. For example, the gate dielectric layer 1010 may comprise oxide with a thickness of about 0.8-1.5 nm. In the example as shown in FIG. 7, the gate dielectric layer 1010 is shown in a "Π" shape. However, the gate dielectric layer 1010 may also include a portion extending on the top surface of the isolation layer 1004. Then, a gate conductor layer 1012 may be formed by, for example, deposition. For example, the gate conductor layer 1012 may comprise polysilicon with a thickness of about 30-200 nm. The gate conductor layer 1012 may fill the gaps between the fins. There are also bulges on the gate conductor layer 1012 due to the fins. Accordingly, the bulges have a relatively high distribution density in the area 100-1 while a relatively low distribution density in the area 100-2.

Figure 8:
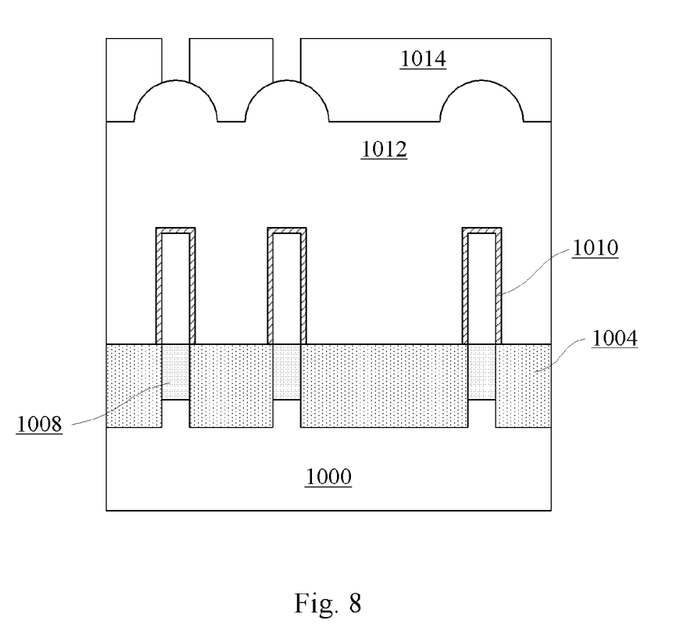
FIG. 8 is a cross sectional view during an intermediate step of a planarization process in an embodiment.

FIG. 8 is a cross sectional view during an intermediate step of a planarization process in an embodiment. The gate conductor layer 1012 may also be planarized by the techniques according to the disclosed technology. In an embodiments, as shown in FIG. 8, patterned photoresist 1014 may be formed on the gate conductor layer 1012. For example, the photoresist 1014 may be patterned similarly to the photoresist 1006 as described above (in connection with FIG. 2), and thus there is an opening on the bulge in the area 100-1, while there is no opening in the area 100-2.

Figure 9:
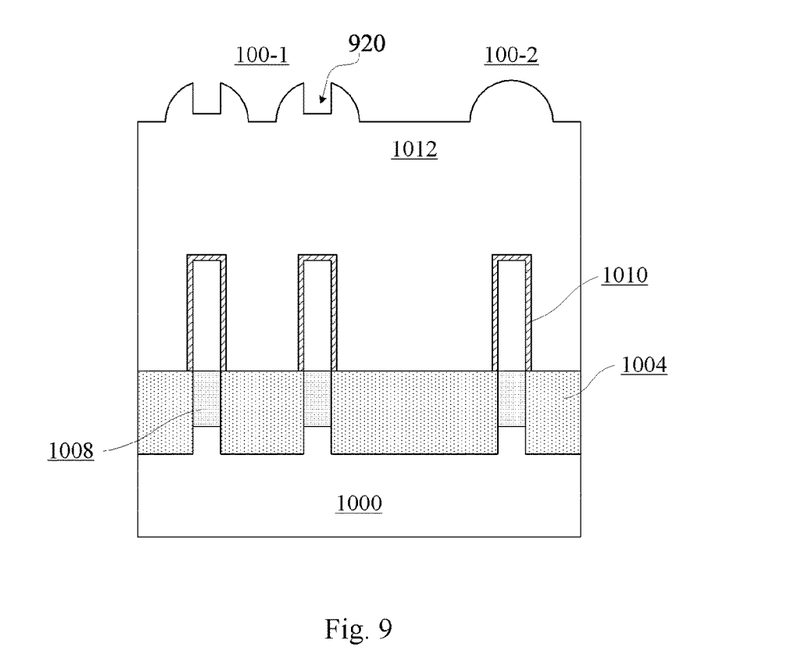
FIG. 9 is a cross sectional view during an intermediate step of a planarization process in an embodiment.

FIG. 9 is a cross sectional view during an intermediate step of a planarization process in an embodiment. The gate conductor layer 1012 may be patterned by RIE with the patterned photoresist 1014 as a mask, to form trenches 920 therein. Here, the patterning of the gate conductor layer 1012 may be controlled, so as to be stopped near the substantially lowest portion of the top surface of the gate conductor layer 1012. In an embodiment, this corresponds to a height within a range of 50 nm below or above the lowest portion of the top surface. The lowest portion of the top surface of the gate conductor layer 1012 may be determined according to, for example, the thickness of the deposited gate conductor layer 1012. Further, the stop point for the patterning of the gate conductor layer 1012 may be determined according to a process parameter such as an etching rate of RIE. Then, the photoresist 1014 may be removed.

As shown in FIG. 9, the bulges in the area 100-1 are partly removed due to the trenches 920. In an embodiment, this may reduce the loading condition in the area 100-1 so that it approximates and may become nearly equal to the loading condition in the area 100-2. This facilitates uniform, or nearly uniform sputtering.

In the example of FIG. 9 trenches 920 are formed in the bulges in the area 100-1, but not in area 100-2. In an embodiment one or more trenches 920 may be formed in bulges in area 100-2, which may reduce the non-uniformity of the loading condition between the two areas 100-1 and 100-2.

Figure 10:
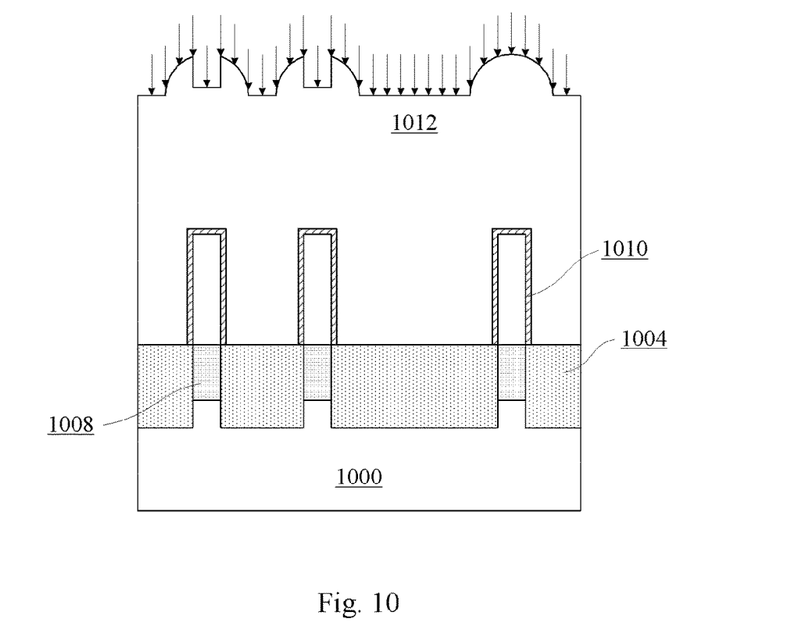
FIG. 10 is a cross sectional view during an intermediate step of a planarization process in an embodiment.

FIG. 10 is a cross sectional view during an intermediate step of a planarization process in an embodiment. The gate conductor layer 1012 may be subjected to sputtering so as to be planarized. For example, plasma such as Ar or N plasma may be used for sputtering. Here, sputtering parameters, such as sputtering power and atmospheric pressure, may be controlled according to a cutting rate of the plasma sputtering on the gate conductor layer 1012, so as to determine a time period for the plasma sputtering. Thus, the plasma sputtering can be performed for a certain time period so as to sufficiently smooth the surface of the gate conductor layer 1012. Since the uniformity of the loading condition across the substrate is improved due to the trenches 920 as described above, the sputtering can be performed in a substantially uniform way, resulting in a relatively flatter surface.

Figure 11:
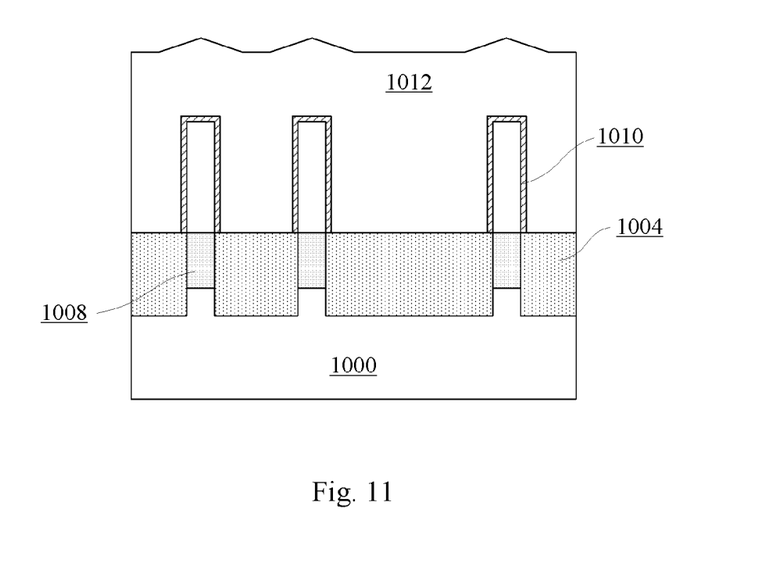
FIG. 11 is a cross sectional view during an intermediate step of a planarization process in an embodiment.

FIG. 11 is a cross sectional view during an intermediate step of a planarization process in an embodiment. FIG. 11 shows a result after planarization by sputtering. Although FIG. 11 shows microscopic fluctuations, the surface of the gate conductor layer 1012 actually has a sufficient flatness, with fluctuations controlled within several nanometers (surface flatness within a tolerance). According to another embodiment of the disclosed technology, CMP may also be performed at a low dose as required on the gate conductor layer 1012 after planarization by sputtering.

Figure 12:
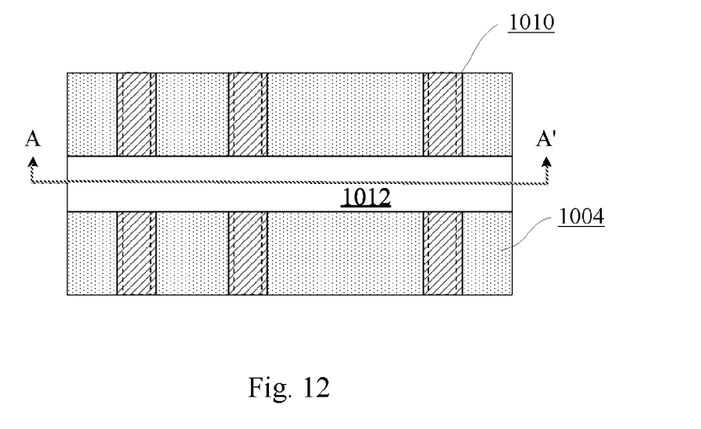
FIG. 12 is a top view during an intermediate step of a planarization process in an embodiment. The line AA' in FIG. 12 is the line along which the cross sectional views in FIGS. 1-11 are drawn.

FIG. 12 is a top view during an intermediate step of a planarization process in an embodiment. The line AA' in FIG. 12 is the line along which the cross sectional views in FIGS. 1-11 are drawn. The gate conductor layer 1012 may be patterned in order to form the gate stack. In the example of FIG. 12, the gate conductor layer 1012 is patterned into be a bar intersecting the fins. According to another embodiment, the gate dielectric layer 1010 may be further patterned with the patterned gate conductor layer 1012 as a mask.

Figure 13A:
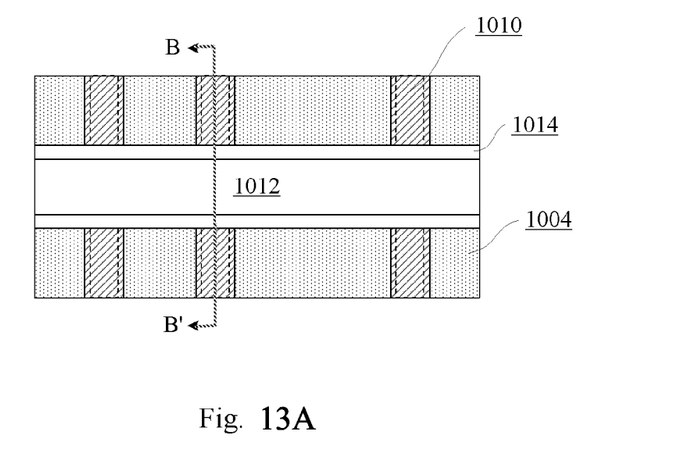
FIG. 13A is a top view during an intermediate step of a planarization process in an embodiment.
Figure 13B:
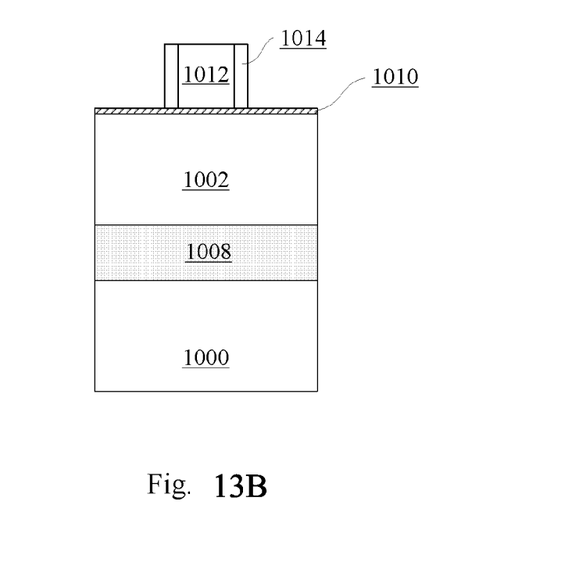
FIG. 13B is a cross sectional view along line BB' in FIG. 13A during an intermediate step of a planarization process in an embodiment.

FIG. 13A is a top view during an intermediate step of a planarization process in an embodiment. FIG. 13B shows a cross-sectional view along line BB' in FIG. 13A. After the gate conductor is patterned, halo implantation and extension implantation may be performed with the gate conductor as a mask. A spacer 1014 may be formed on side walls of the gate conductor layer 1012. For example, nitride such as silicon nitride with a thickness of about 5-20 nm may be formed by deposition, and then subjected to RIE to form the spacer 1014. There are various methods to form the spacer, known to those with skill in the art; detailed descriptions of forming spacers are omitted here. When the trenches between the fins are tapered from top down (which is a common situation due to characteristics of etching), the spacer 1014 may have substantially no portion formed on side walls of the fins.

After the spacer is formed, source/drain (S/D) implantation may be performed with the gate conductor and the spacer as a mask. Subsequently, annealing may be performed to activate the implanted ions, so as to form source/drain regions, resulting in FinFETs.

In the embodiment as illustrated above, the gate stack is directly formed after the fins are formed. However, the disclosed technology is not limited to this. For example, the disclosed technology is also applicable to the gate last process. Further, the strained source/drain technique may also be incorporated.

According to another embodiment of the disclosed technology, the gate dielectric layer 1010 and the gate conductor layer 1012 formed in FIG. 7 may be a sacrificial gate dielectric layer and a sacrificial gate conductor layer. Next, the process may be continued in the way as described in connection with FIGS. 8-12, 13A, and 13B.

Figure 14:
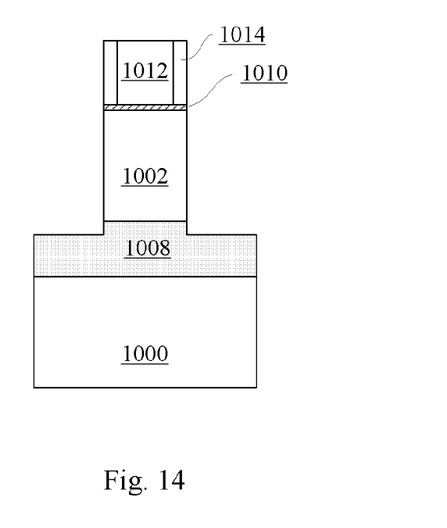
FIG. 14 is a cross sectional view during an intermediate step of a planarization process in an embodiment.

FIG. 14 is a cross sectional view during an intermediate step of a planarization process in an embodiment. Exposed portions of the sacrificial gate dielectric layer 1010 may be selectively removed (for example, by RIE). In a case where both the sacrificial gate dielectric layer 1010 and the isolation layer 1004 comprise oxide, the RIE of the sacrificial gate dielectric layer 1010 may have substantially no impact on the isolation layer 1004 because the sacrificial gate dielectric layer 1010 is relatively thin. This operation is not required if the sacrificial gate dielectric layer has been further patterned with the sacrificial gate conductor as a mask in the process of forming the sacrificial gate stack as described above.

Next, portions of the fin 1002 which are exposed due to removal of the sacrificial dielectric layer 1010 may be selectively removed (for example, by RIE). The etching of those portions of the fin 1002 may be carried out until the punch-through stopper 1008 is exposed. Due to the presence of the sacrificial gate stack (the sacrificial gate dielectric layer, the sacrificial gate conductor and the spacer), a portion of the fin 1002 may be left under the sacrificial gate stack.

Figure 15:
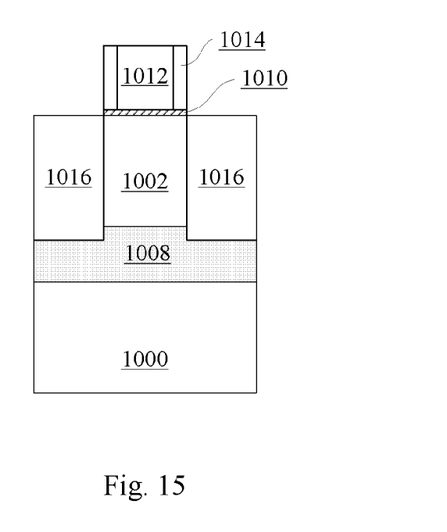
FIG. 15 is a cross sectional view during an intermediate step of a planarization process in an embodiment.

FIG. 15 is a cross sectional view during an intermediate step of a planarization process in an embodiment. A semiconductor layer 1016 may be formed on exposed portions of the fin by, for example, epitaxy. Then, source/drain regions may be formed in the semiconductor layer 1016. In an embodiment, the semiconductor layer 1016 may be doped in-situ while being grown. For example, n-type in-situ doping may be performed for an n-type device; while p-type in-situ doping may be performed for a p-type device. Moreover, in order to further improve the performances, the semiconductor layer 1016 may comprise a material different from that of the fin 1002 to apply strain to the fin 1002 (in which a channel of the device will be formed). For example, in a case where the fin 1002 comprises Si, the semiconductor layer 1016 may comprise Si:C (where an atomic percentage of C is, for example, about 0.2-2%) to apply tensile stress for the n-type device, or SiGe (where an atomic percentage of Ge is, for example, about 15-75%) to apply compressive stress for the p-type device.

In a case where the sacrificial gate conductor layer 1012 comprises polysilicon, the growth of the semiconductor layer 1016 may occur on the top surface of the sacrificial gate conductor 1012. This is not shown in the drawings.

Figure 16:
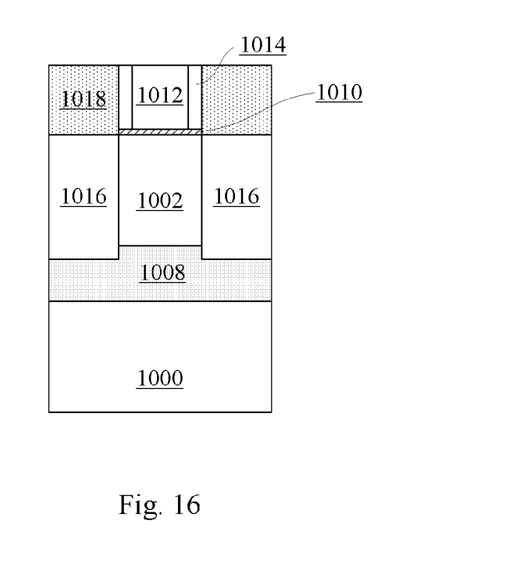
FIG. 16 is a cross sectional view during an intermediate step of a planarization process in an embodiment.

FIG. 16 is a cross sectional view during an intermediate step of a planarization process in an embodiment. A further dielectric layer 1018 may be formed by, for example, deposition. The dielectric layer 1018 may comprise oxide. Subsequently, the dielectric layer 1018 may be planarized by CMP. The CMP may be stopped at the spacer 1014, so as to expose the sacrificial gate conductor 1012.

Figure 17:
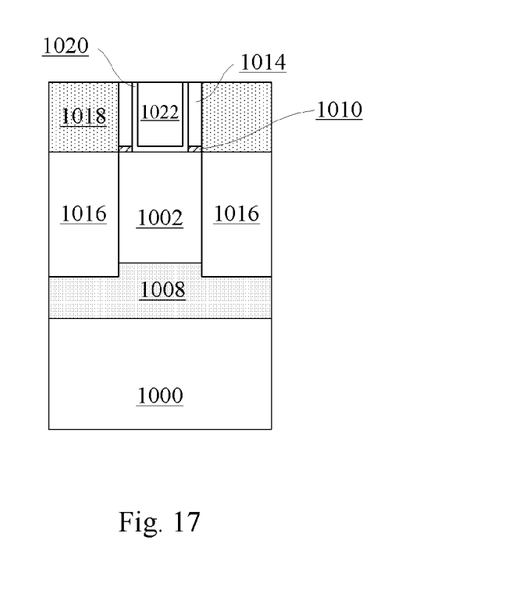
FIG. 17 is a cross sectional view during an intermediate step of a planarization process in an embodiment.

FIG. 17 is a cross sectional view during an intermediate step of a planarization process in an embodiment. Then, as shown in FIG. 17, the sacrificial gate conductor 1012 may be selectively removed by, for example, tetramethylammonium hydroxide (TMAH) solution, so as to form a gap inside the spacer 1014. According to another example, the sacrificial gate dielectric layer 1010 may be further removed. Next, a gate dielectric layer 1020 and a gate conductor layer 1022 may be formed in the gap, so as to form a final gate stack. The gate dielectric layer 1020 may comprise a high-K gate dielectric, such as $HfO_2$, with a thickness of about 1-5 nm. The gate conductor layer 1022 may comprise a metal gate conductor. In an embodiment, a work function adjustment layer (not shown) may also be formed between the gate dielectric layer 1020 and the gate conductor layer 1022.

Figure 18:
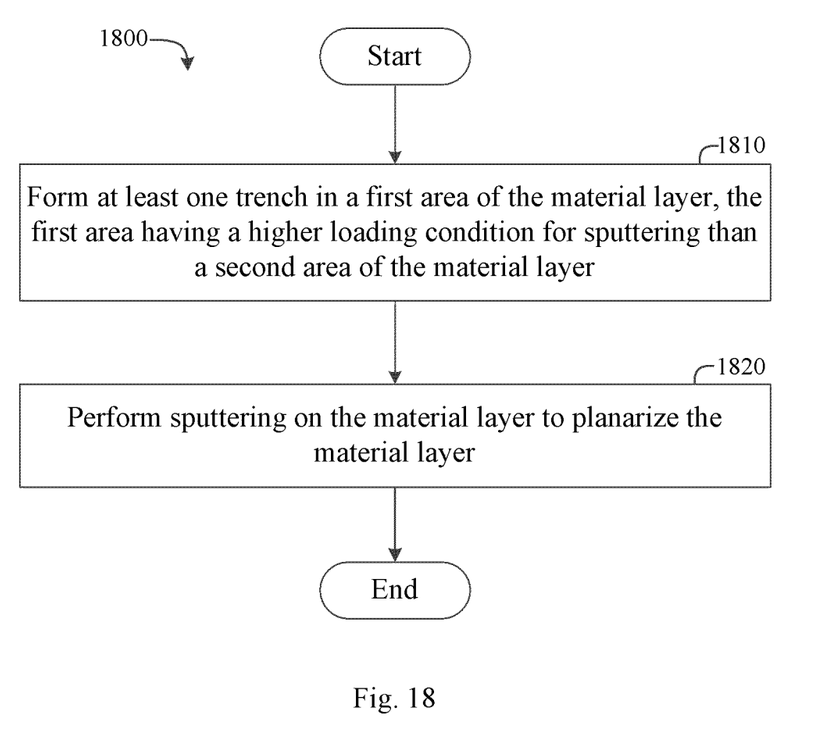
FIG. 18 is a flowchart illustrating an embodiment of a method of planarizing a material layer formed on a substrate in an embodiment.

FIG. 18 is a flowchart illustrating an embodiment of a method 1800 of planarizing a material layer formed on a substrate in an embodiment. In block 1810, method 1800 forms at least one trench in a first area of the material layer, the first area having a higher loading condition for sputtering than a second area of the material layer. In an embodiment, the substrate has one or more features formed on it, and the material layer is formed on the substrate to cover the features. In an embodiment, the material layer includes a raised portion due to the covered features; the raised portion corresponds to the first area. In an embodiment, features are distributed non-uniformly on the substrate with features distributed more densely in a first area than a second area. In an embodiment, more trenches are formed in the first area than in the second area. In an embodiment, no trenches are formed in the second area. In an embodiment, a first mask for forming the at least one trench is designed according to a second mask for forming the at least one features. In an embodiment, the features comprise a fin, and the material layer comprises dielectric.

In block 1820, method 1800 performs sputtering on the material layer to planarize the material layer. In an embodiment, the sputtering comprises sputtering Ar or N plasma.

In an embodiment, method 1800 further includes etching the material layer back to expose the fin after the sputtering. In an embodiment, method 1800 further includes performing ion implantation to form a punch-through stopper in a portion of the fin which is located below a surface of the further back-etched material layer after etching the material layer back.

In an embodiment, the method 1800 further includes forming a sacrificial gate stack across the fin on the material layer after the ion implantation. Method 1800 may further include selectively etching the fin by using the sacrificial gate stack as a mask, until the punch-through stopper layer is exposed. Method 1800 may further include forming a sacrificial gate stack may include forming a semiconductor layer on exposed portions of the fin to form source/drain regions. Method 1800 may further include replacing the sacrificial gate stack with a gate stack.

In an embodiment at least one of the features is a fin, and the material layer in includes a gate conductor layer which covers the fin via a gate dielectric layer. Method 1800 may further include forming a sacrificial gate dielectric layer on the material layer. Method 1800 may further include forming a sacrificial gate conductor layer on the sacrificial gate dielectric layer. Method 1800 may further include planarizing and patterning the sacrificial gate conductor layer. Method 1800 may further include forming a spacer on a side wall of the patterned sacrificial gate conductor.

In an embodiment method 1800 further includes planarizing the sacrificial gate conductor layer. Method 1800 may planarize the sacrificial gate conductor by forming a trench in a third area of the sacrificial gate conductor layer, the third area having a higher loading condition than a fourth area for sputtering. Method 1800 may further include performing sputtering on the sacrificial gate conductor layer to planarize the sacrificial gate conductor layer. In an embodiment, the sacrificial gate conductor layer includes a raised portion due to the underlying feature, the raised portion corresponding to the third area. In an embodiment, the substrate includes a plurality of fins distributed non-uniformly thereon, forming more trenches in the third area in which the fins are distributed more densely than in the fourth area. In an embodiment, no trenches are formed in the fourth area.

Although in the above embodiments the technology of the disclosed technology is described as being applied to manufacture of FinFETs, the disclosed technology is not limited thereto. The technology of the disclosed technology may also be applicable to various applications where planarization is needed.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

What is claimed is:

1. A method of planarizing a material layer formed on a substrate, wherein the substrate comprises at least one feature formed thereon and the material layer is formed on the substrate to cover the at least one feature, wherein the material layer comprises a raised portion due to the covered at least one feature, wherein the raised portion corresponds to a first area, and wherein the material layer comprises a dielectric material, the method comprising:
   forming at least one trench in a first area of the material layer, the first area having a higher loading condition for sputtering than a second area of the material layer;
   performing sputtering on the material layer to planarize the material layer; and
   etching the material layer back to expose the fin after the sputtering, wherein the at least one feature comprises a plurality of fins distributed non-uniformly thereon, wherein more trenches of the at least one trench are formed in the first area and with smaller intervals than in the second area, and wherein the plurality of fins are distributed more densely in the first area than in the second area.

2. The method of claim 1, wherein no trenches are formed in the second area.

3. The method of claim 1, wherein a first mask for forming the at least one trench is designed according to a second mask for forming the at least one feature.

4. The method of claim 1, wherein the sputtering comprises sputtering Ar or N plasma.

5. The method of claim 1, further comprising performing ion implantation to form a punch-through stopper in a portion of the fins which is located below a surface of the further back-etched material layer after etching the material layer back.

6. The method of claim 5, further comprising:
 forming a sacrificial gate stack across the fins on the material layer after the ion implantation;
 selectively etching the fins by using the sacrificial gate stack as a mask, until the punch-through stopper layer is exposed;
 forming a semiconductor layer on exposed portions of the fins to form source/drain regions; and
 replacing the sacrificial gate stack with a gate stack.

7. The method of claim 1, wherein the material layer comprises a gate conductor layer which covers the fins via a gate dielectric layer.

8. The method of claim 6, wherein forming the sacrificial gate stack comprises:
 forming a sacrificial gate dielectric layer on the material layer;
 forming a sacrificial gate conductor layer on the sacrificial gate dielectric layer;
 planarizing and patterning the sacrificial gate conductor layer; and
 forming a spacer on a side wall of the patterned sacrificial gate conductor.

9. The method of claim 8, wherein planarizing the sacrificial gate conductor layer comprises:
 forming a trench in a third area of the sacrificial gate conductor layer, the third area having a higher loading condition than a fourth area for sputtering; and
 performing sputtering on the sacrificial gate conductor layer to planarize the sacrificial gate conductor layer.

10. The method of claim 9, wherein the sacrificial gate conductor layer comprises a raised portion due to the underlying feature, and wherein the raised portion corresponds to the third area.

11. The method of claim 10, wherein more trenches are formed in the third area in which the fins are distributed more densely than in the fourth area.

12. The method of claim 11, wherein no trenches are formed in the fourth area.

* * * * *